United States Patent
Kinzer

[11] Patent Number: 6,100,572
[45] Date of Patent: *Aug. 8, 2000

[54] AMORPHOUS SILICON COMBINED WITH RESURF REGION FOR TERMINATION FOR MOSGATED DEVICE

[75] Inventor: Daniel M. Kinzer, El Segundo, Calif.

[73] Assignee: International Rectifier Corp., El Segundo, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/822,398

[22] Filed: Mar. 20, 1997

Related U.S. Application Data
[60] Provisional application No. 60/013,761, Mar. 20, 1996.

[51] Int. Cl.[7] .............................. H01L 23/58; H01L 29/76
[52] U.S. Cl. ......................... 257/492; 257/488; 257/493; 257/646; 257/640; 257/339
[58] Field of Search ..................... 257/492, 488, 257/490, 493, 494, 495, 640, 646, 649, 328, 339, 341, 342

[56] References Cited

U.S. PATENT DOCUMENTS

| | | | |
|---|---|---|---|
| 5,173,435 | 12/1992 | Harada | 257/328 |
| 5,374,833 | 12/1994 | Nariani et al. | 257/646 |
| 5,523,604 | 6/1996 | Merrill | 257/646 |
| 5,629,552 | 5/1997 | Zommer | 257/490 |
| 5,723,882 | 3/1998 | Okabe et al. | 257/488 |

*Primary Examiner*—Steven H. Loke
*Attorney, Agent, or Firm*—Ostrolenk, Faber, Gerb & Soffen, LLP

[57] ABSTRACT

A termination structure for semiconductor devices and a process for fabricating the termination structure are described and include a layer of amorphous silicon for passivating and terminating the device junctions. The layer of amorphous silicon is deposited atop the metal contact and atop and overlying insulation layer and expose the source pad. A layer of silicon nitride may be deposited atop the layer of amorphous silicon. The layer of amorphous silicon minimizes gate leakage.

9 Claims, 5 Drawing Sheets

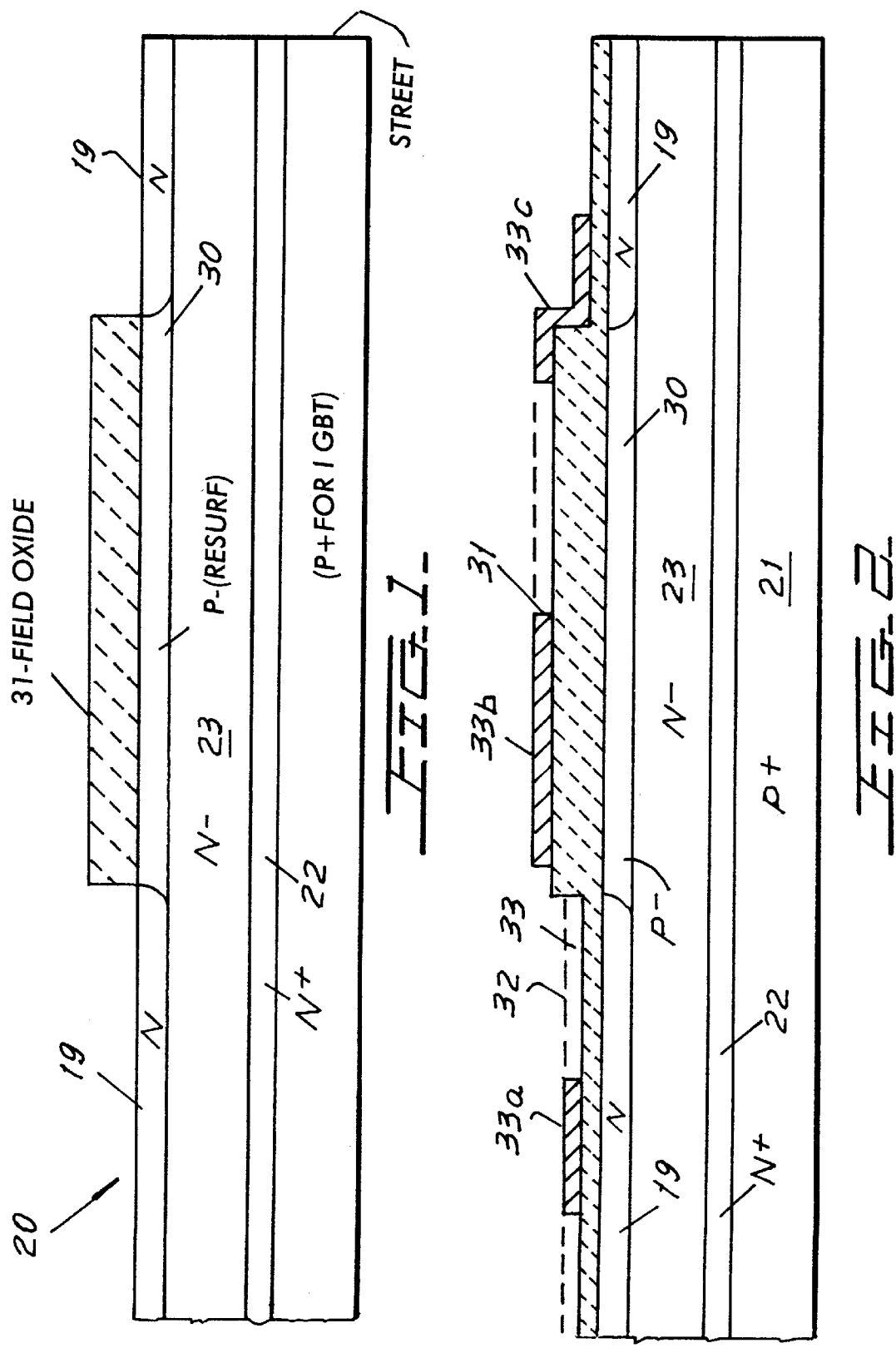

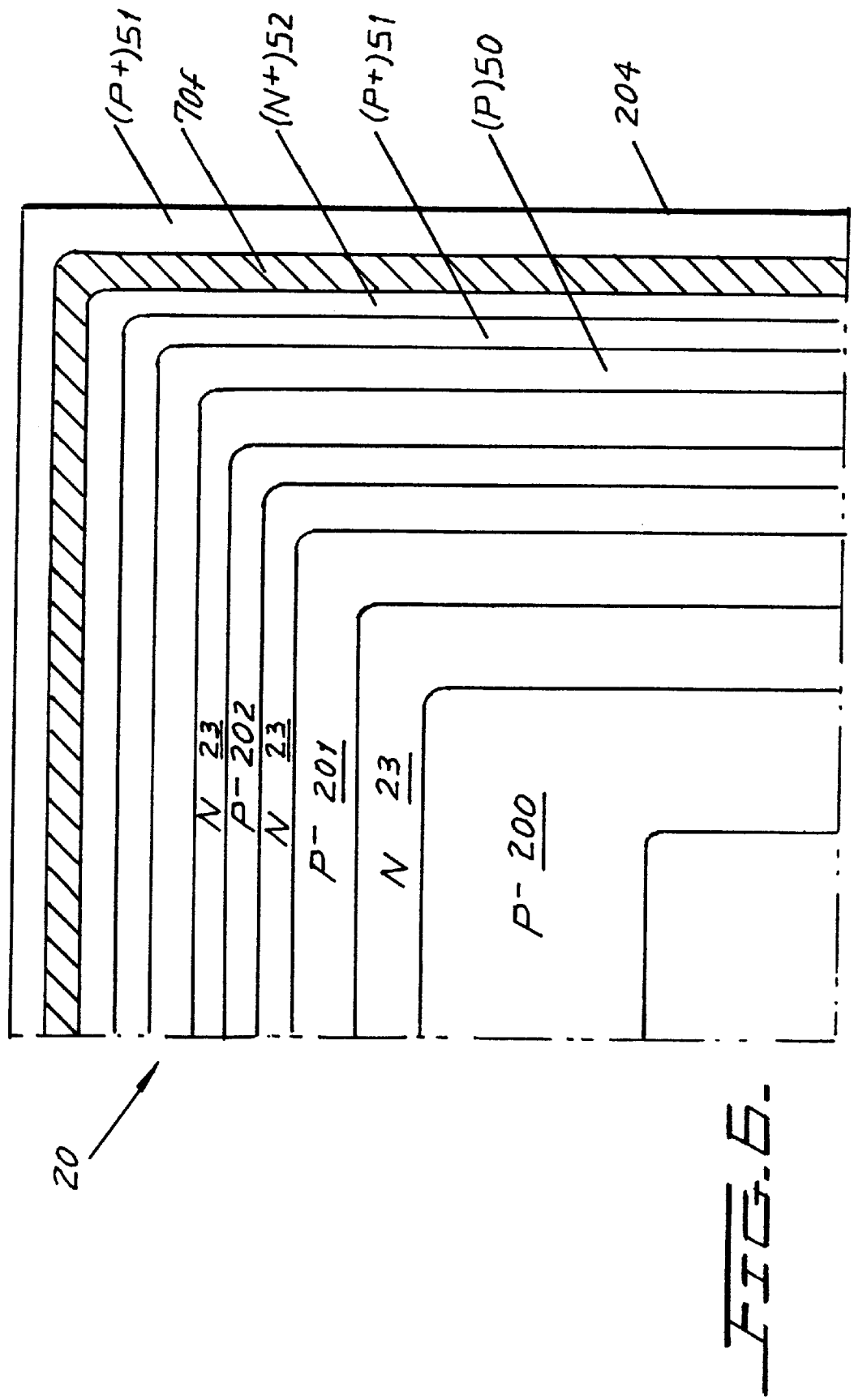

AMORPHOUS SILICON COMBINED WITH RESURF REGION FOR TERMINATION FOR MOSGATED DEVICE

This application claims the priority of Provisional Application Serial No. 60/013,761, filed Mar. 20, 1996.

BACKGROUND OF THE INVENTION

The present invention relates to MOS gate controlled ("MOSgated") semiconductor devices and, more particularly, to a termination structure for high voltage (600 volts or higher) MOSgated devices or high voltage transistors.

It is known to use a resurf region to terminate a power MOSFET. Alternatively, amorphous silicon can be used to passivate and terminate the MOSFET junctions.

SUMMARY OF THE INVENTION

In accordance with the present invention, a combined resurf region and semi-insulating layer form a high voltage termination structure.

The novel combination is carried out in a process which employs only five masking steps. The mask sequence includes:

1. an active (field oxide) patterning mask;
2. a polysilicon layer patterning mask;
3. a contact window forming mask;
4. a metal layer patterning mask; and
5. a passivation layer patterning mask.

The resurf region is formed by a blanket implant.

As an alternative, a P$^+$ mask and diffusion are added, and the first mask defines the primary MOSgate junction. This process simplifies the edge layout and improves ruggedness and breakdown characteristics. No active regions face the termination region.

As another alternative, the resurf region is formed using an additional P$^-$ resurf mask. This process removes the compensation requirement and allows a multi-zone resurf effect. The process also permits the modification of the density of the implanted area from 100% near the primary zone to 0% near the street.

An aspect of the present invention is directed to a termination structure for a semiconductor device having a substrate of a first conductivity type and a process for fabricating the termination structure. A lightly doped layer of a second conductivity type, which is opposite to the first conductivity type, is formed by introducing impurities into the silicon substrate to a given depth. A layer of field insulation material is formed atop the silicon substrate and forms one or more openings and at least one remaining portion. A region of impurities of the first conductivity type is formed in an area of the silicon substrate that is located beneath the openings in the layer of field insulation material to a depth that is substantially equal to that of the given depth. A layer of polysilicon is formed in the openings of the field insulation material and atop the remaining portion of the layer. Spaced openings are formed in the polysilicon and have a respective first part that is formed in the opening of field insulation material layer adjacent to the remaining portion of the field insulation material. A polysilicon field plate is defined by a portion of the polysilicon layer that is atop the layer of field insulation material. Diffused regions are formed by impurities of the first and second conductivity types that are introduced into surface regions of a silicon substrate beneath the first part of the openings in the polysilicon layer. An overlaying insulation layer includes openings which expose the polysilicon field plate and which expose underlying areas of the surface regions of the silicon substrate. A conductive layer include at least one electrode which contacts the underlying areas of the surface of the silicon substrate and one or more other electrodes which contact the polysilicon field plate. A layer of amorphous silicon or other semi-insulating film is formed atop the conductive layer and atop the overlaying insulation layer and has openings that expose part of the overlaying insulation layer and part of the conductive layer.

A layer of silicon nitride may be deposited atop a layer of amorphous silicon or other semi-insulating film and have openings corresponding to that of the film. The lightly doped layer of impurities of a second conductivity type may include a plurality of lightly doped regions and may be formed by a mask layer formed atop the silicon substrate which masks introduction of the impurities.

Two polysilicon field plates may be formed, and an electrode contacts one of the field plates. A portion of the polysilicon field plate may overlie a portion of the diffused regions. A further electrode may be formed atop the remaining portion of the layer of field insulation material, and a portion of the layer of amorphous silicon or other semi-insulating film is deposited atop the electrode. A second opening in the field insulation material may border the semiconduction device and form a street region. The conductive layer may include a termination ring that has a first portion located above the layer field insulation material and a second portion located atop the street region.

The first conductivity type may be N type and the second conductivity type may be P type. Each of the spaced openings in the polysilicon layer may include a second part formed atop the remaining portion of the layer field insulation material. The field insulation material may be silicon dioxide.

The impurities of a first and second conductivity types may be introduced by implantation and drive-in. The openings in the layer of amorphous silicon or other semi-insulating film may expose a portion of the electrode. The overlaying insulation layer may be a low temperature oxide.

Another aspect of the present invention is a semiconductor device having the termination structure of the present invention and includes a process for fabricating the semiconductor device. Included is a layer of gate insulation material that is formed atop the silicon substrate in at least one opening in the layer field insulation material. Openings are formed in the polysilicon layer and include cell openings that have a first part formed atop the layer of gate insulation material. First, second and third diffused regions are formed of the second, first and second conductivity types, respectively, and are introduced into the silicon substrate surface regions. The second diffused regions have a final depth which is less than that of the third diffused regions, and the first diffused regions are deeper and wider than and have a lower concentration than the third diffused regions. Depressions are etched in the underlying areas of the silicon substrate surface regions and have a depth greater than the depth of the second diffused regions. The conductive layer includes at least one gate contact which contacts a polysilicon field plate and at least one source contact which contacts the third diffused regions at the bottom of the depressions and the second diffused regions at the upper portions of the depressions.

Two field plates may be present and the gate contact contacting one of the two field plates.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which:

FIG. 1 shows a cross-section view of a silicon chip after the active mask process step in accordance with the invention.

FIG. 2 shows a cross-section view of the chip of FIG. 1 following the polysilicon mask step.

FIG. 6 shows a top view of a corner portion of a chip according to another embodiment of the invention in which the resurf region is formed of a multi-zone structure.

DETAILED DESCRIPTION OF THE DRAWINGS

Figure 3:
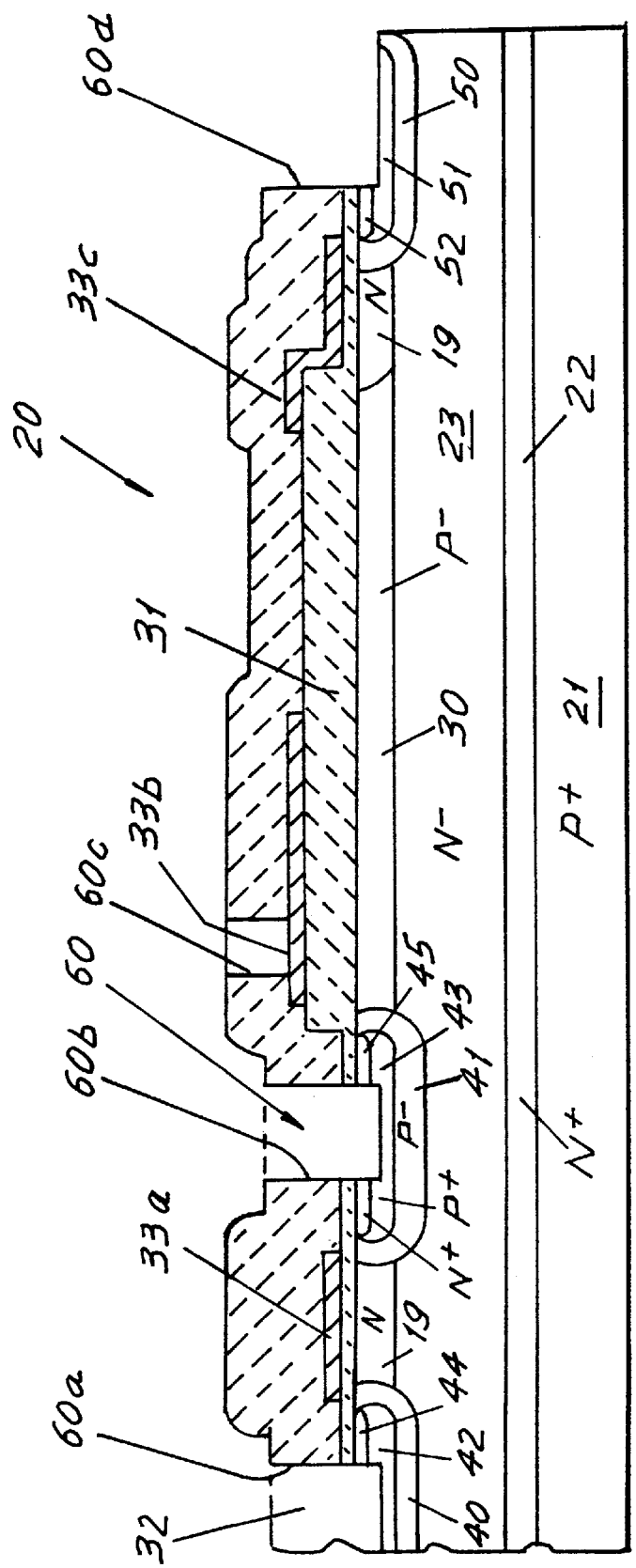
FIG. 3 is a cross-section view of the chip of FIG. 2 following the contact mask step.

Referring first to FIG. 1, there is shown a cross-section view of the outer peripheral area of a chip 20 of a silicon wafer as processed by the process sequence of the invention.

Chip 20 may be a part of a larger thin wafer of monocrystalline silicon which is separated into a plurality of identical chips after processing the wafer. Here, chip 20 is shown for an IGBT and comprises a conventional $P^+$ body 21, and a conventional thin $N^+$ buffer layer 22. An epitaxially grown junction-receiving region 23 is formed atop buffer layer 22. The thickness and concentration of region 23 is selected in accordance with the desired voltage rating of the device. As an example, the epitaxial layer 23 may have a thickness of 160 micrometers for a 600 volt IGBT whereas, for a 1200 volt device, the layer has a thickness of 250 micrometers. For either thickness, the layer has a conventionally suitable impurity concentration.

While the invention is described for an IGBT, it will be apparent that the concepts of the invention apply to any MOSgated device, including power MOSFETs. For power MOSFETs, the structure is the same as described herein except that the $P^+$ body 21 and $N^+$ buffer 22 are replaced by an N+ substrate or body. Further, it will be apparent that the impurity types can be reversed to produce P channel devices in place of the N channel device to be described.

In accordance with the process of the invention, and as shown in FIG. 1, a $P^-$ resurf blanket implant 30 is applied to the top surface of chip 20. The implant 30 has a total dose of about 1E12. Thereafter, a field oxide layer 31, which is typically silicon dioxide, is grown atop the $P^-$ region 30 to a thickness of about 7,500 Å. The field oxide is then masked at the termination areas of the chip and then etched to form openings which expose what will become the active area of the chip, namely the regions that will receive the active junctions. The active junctions may have any desired topology, such as those shown in U.S. Pat. No. 5,008,725 entitled "Plural Polygon Source Pattern for MOSFETs" to Alexander Lidow, et al., issued Apr. 16, 1997. An N region 19, having a depth equal to the depth of $P^-$ region 30 and having a higher concentration than that of the $N^-$ region 23 is then formed using the field oxide 31 as a mask in the known manner. The N region 19 of the active area reduces the resistivity in the common conduction regions of the active area. The N region 19 of the terminal area prevents punch through from the $P^-$region 30 to the street.

Thereafter, a gate oxide layer 32 is grown atop the chip surface to a thickness of 1,000 Å, for example. A layer of polysilicon 33 is then grown atop the gate oxide 32 and is masked and then patterned using a suitable etch to form openings and discrete polysilicon regions, leaving a gate lattice 33a over the active area shown in U.S. Pat. No. 5,008,725 and leaving polysilicon field plates 33b and 33c. The portions of polysilicon layer 33 which are removed are shown by the dotted lines in FIG. 2.

Thereafter, referring to FIG. 3, spaced P base regions 40 and 41, $P^+$ regions 42 and 43 and $N^+$ source regions 44 and 45 are formed in the openings in the polysilicon to create two respective active cells of the device, using the patterned polysilicon as a mask. The active area contains hundreds or thousands of such cells. At the same time, termination diffusions 50, 51 and 52, which are P, $P^+$ and $N^+$ respectively are also formed at the surface of the substrate at the substrate's end. The P diffusions have a depth of 1.5 micrometers, for example, and are typically formed by an implant dose of 1E15 followed by a diffusion for 90 minutes at 900° C. Then, the $N^+$ regions are formed by a relatively high implant dose of arsenic or phosphorous, and the $P^+$ regions are subsequently formed by a relatively high boron implant dose.

Following the formation of the diffusion regions shown in FIG. 3, a layer 60 of undoped low temperature oxide (LTO) is formed over the surface of the chip to a thickness of about 7,500 Å. Then, the $N^+$ region implants are driven in to form the regions 42, 43 and 44, 45. The $N^+$ layer will typically be shallower than the $P^+$ layer by an amount selected by the designer.

A contact mask is then formed over the LTO layer 60 and the LTO is anisotopically etched, as shown in the dotted lines in FIG. 3. Thus, a central opening is formed in the center of each active cells (openings 60a and 60b). LTO layer 60 is formed to overlap polysilicon field plates 33a, 33b and 33c. An opening 60c is formed above the polysilicon plate 33b, and an opening 60d is also formed. Thereafter, shallow depressions are etched in the silicon that is exposed by openings 60a, 60b and 60d, as is described in U.S. patent application Ser. No. 08/299,533 filed Sep. 1, 1994 (IR-1113), which is incorporated herein by reference. As an example, the silicon substrate may be anisotopically etched and then exposed to a wet etch which isotopically etches the sidewalls of the LTO.

Figure 4:
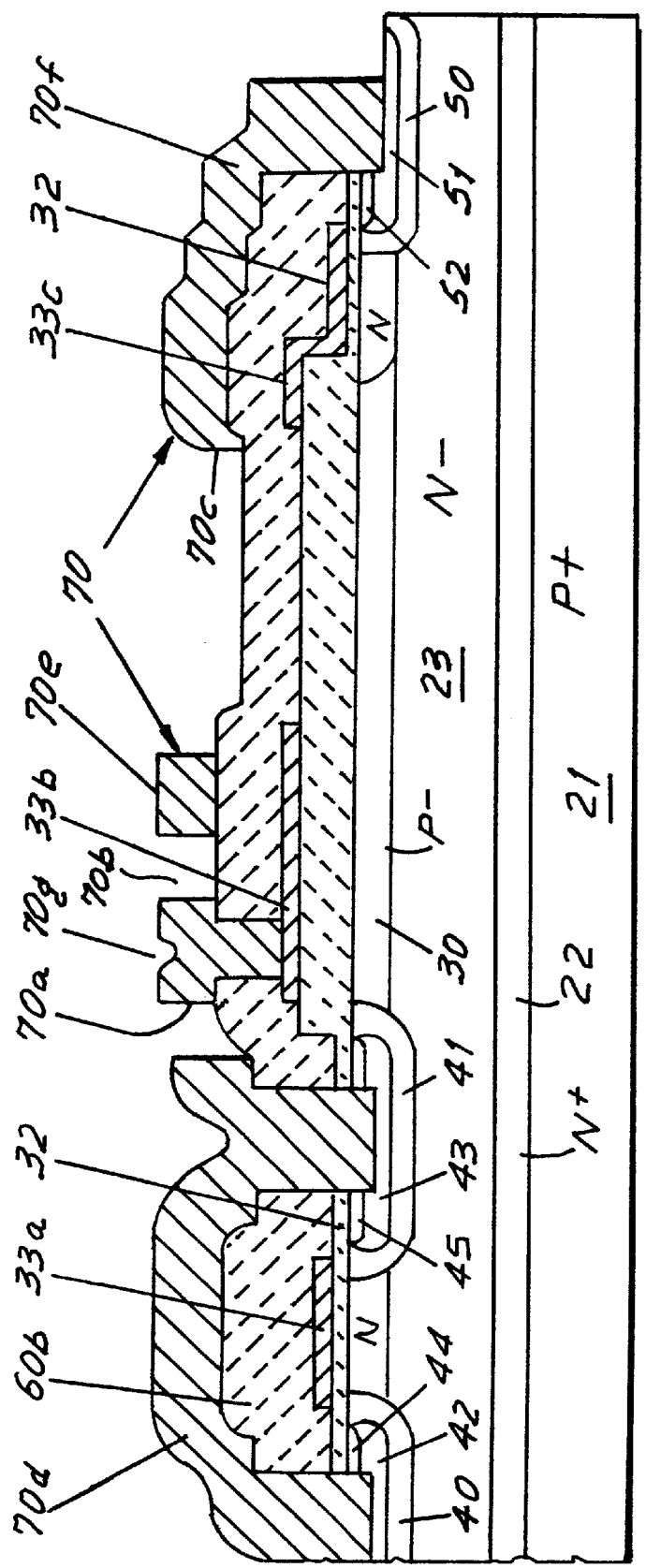
FIG. 4 is a cross-section view of the chip of FIG. 3 following the metal mask step.

Thereafter, as shown in FIG. 4, a metal layer 70, for example aluminum, is deposited atop the chip. The metal 70 enters openings 60a, 60b, 60c and 60d, and thus, contact is made to the $N^+$ regions 44, 45 and 52, to $P^+$ regions 42, 43 and 51 and to the polysilicon field plate 33b.

Thereafter, a contact mask layer is applied to the surface of aluminum layer 70 and is patterned. The metal 70 is then etched at regions 70a, 70b and 70c, thus defining a source contact 70d, a gate bus 70g attached to plate 33b, a source field plate 70e and a termination ring 70f.

Figure 5:
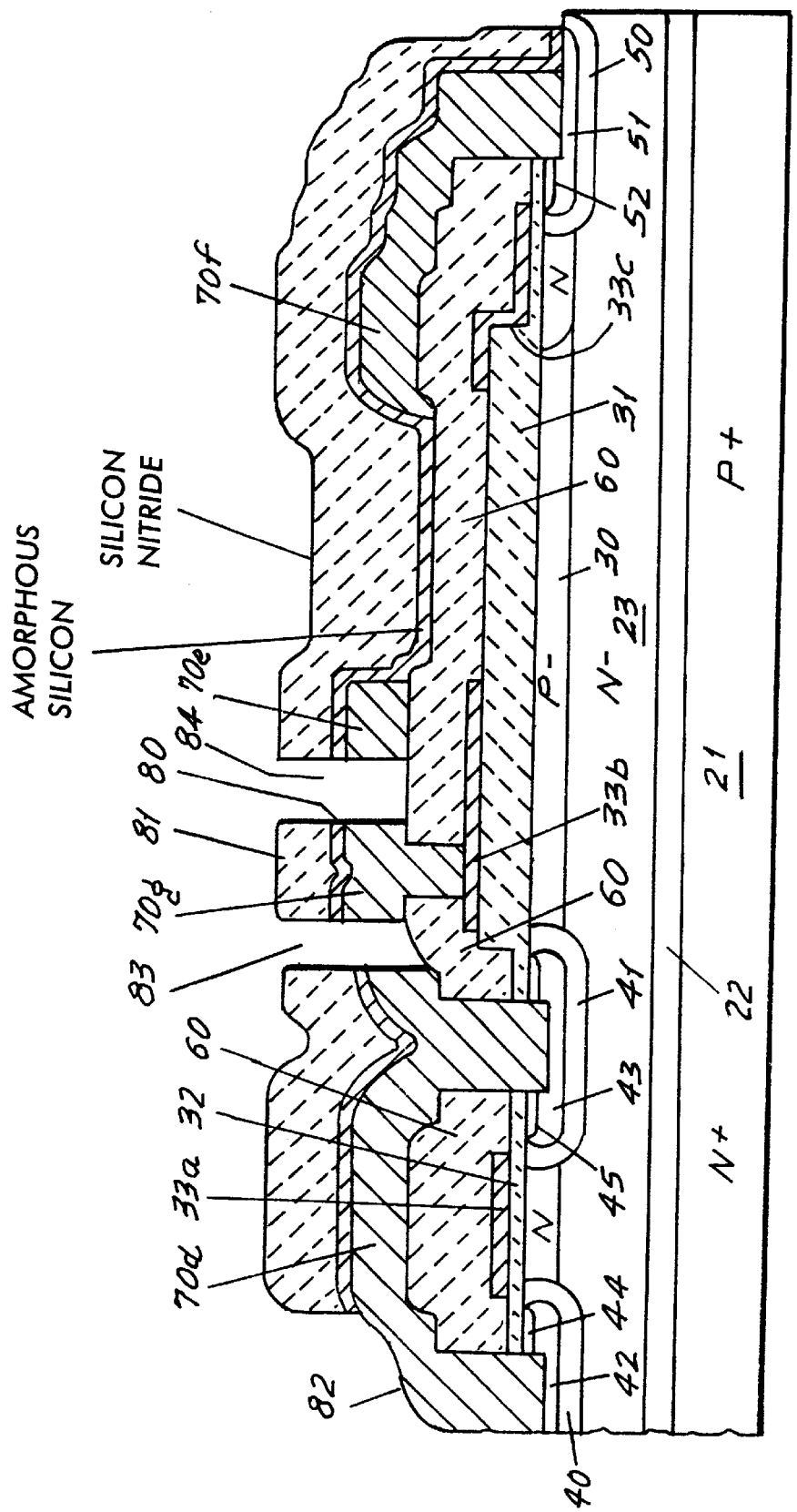
FIG. 5 is a cross-section view of the chip of FIG. 4 following the passivation mask step.

Thereafter, as shown in FIG. 5, an amorphous silicon ("α silicon") semi-insulating film layer 80 and a silicon nitride layer 81 are deposited atop the exposed chip surface. Alternatively, another type of semi-insulating film, such as SIPOS, may be used in place of amorphous silicon. A passivation mask layer is then applied over the nitride layer 81 to allow etching away of region 82 using a plasma etch which, as shown in FIG. 5, exposes a source pad, and to etch away the amorphous silicon 80 and nitride 81 in the bottom of notches (opening) 83 and 84. This etching minimizes gate leakage. As shown in FIG. 5, aluminum layer 70 has been etched as described above to define a source field plate 70e atop the portion of low temperature oxide layer 60 remaining after LTO layer 60 has been etched as described above. Source field plate 70e is covered by amorphous silicon layer 80 as described above.

In a preferred embodiment of FIG. 5, the following lateral dimensions can be used:

1) The poly plate 33a may have a width of 15 micrometers;
2) the distance from the right-hand edge of plate 33a to the right-hand edge of plate 70e is 10 micrometers;
3) the distance from the right-hand edge of source plate 70e to the left-hand edge of plate 70f (shown shortened for drawing convenience) is 120 micrometers;
4) the distance from the left-hand edge of plate 70f to the left-hand edge of plate 33c is 10 micrometers;
5) the length of the higher step of poly plate 33c is 10 micrometers;
6) the length of the lower step of plate 33c is 50 micrometers; and
7) the total length of the P⁻ resurf region 30 is 165 micrometers. The voltage withstand of the P⁻ resurf is about 10 volts per micrometer.

FIG. 6 shows another embodiment of the invention in which the blanket implant 30 of FIGS. 1 to 5 is replaced by a multi-zone resurf region having spaced P⁻ zones 200, 201 and 202 (any number of zones can be used). The zones are progressively narrower and are spaced by progressively narrower spacings in the direction of the outer street 204 of the chip. An additional mask step is required to segment the P⁻ implant shown in FIG. 1. Further, the density of the implanted resurf area can be desirably varied from 100% near the active central area to 0% near the street of the chip.

As a further alternative, a P⁺ mask and diffusion can be added to the first mask step for forming the primary junctions, and a P⁺ ring is also formed around the periphery of the chip. The source is also prevented from reaching the edge of the chip. This will simplify the edge layout and will improve ruggedness and breakdown. No active regions will then face the termination.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A termination structure for a semiconductor device having an active region, said semiconductor device having a silicon substrate of a first conductivity type, said termination structure comprising:

a lightly doped resurf layer of a second conductivity type, which is opposite said first conductivity type, formed in said silicon substrate to a given and constant depth and in contact with the active region;

at least one region of impurities of said first conductivity type formed adjacent to said lightly doped resurf layer and having a depth that is substantially equal to said given depth;

a layer of field insulation material formed atop a first portion of said at least one region of impurities;

a first polysilicon field plate and a second polysilicon field plate which is laterally spaced from said first field plate, said first field plate being disposed atop a second portion of said at least one region of impurities which is not covered by said layer of field insulation material and extending to cover a portion of said layer of field insulation material;

said second polysilicon field plate being disposed atop said layer of field insulation material and being further disposed at least partly over an active junction of said active region;

at least two diffused regions formed of impurities of said first and second conductivity types, respectively, introduced into surface regions of said silicon substrate that are located at an end of said silicon substrate;

an overlaying insulation layer formed over said layer of field insulation material and over said first and second polysilicon field plates;

a conductive layer disposed atop said overlaying insulation layer, a portion of which is removed to define a first electrode which contacts said active region and a second electrode which contacts said second polysilicon field plates;

and an amorphous silicon layer disposed atop said first and second electrodes and atop said overlaying insulation layer.

2. The device of claim 1 further comprising a layer of silicon nitride disposed atop said amorphous silicon layer.

3. The device of claim 1, wherein a portion of said first polysilicon field plate overlies a portion of said diffused regions.

4. The device of claim 1, wherein said conductive layer includes a further electrode disposed atop a remaining portion of said overlaying insulation layer and wherein said amorphous silicon layer includes a portion that is disposed atop said further electrode.

5. The device of claim 1, wherein a border of said layer of field insulation material proximate a border of said semiconductor device defines a street region therebetween, and wherein a portion of said conductive layer is removed to define a termination ring having a first portion located atop said layer of field insulation material and a second portion located atop said street region.

6. The device of claim 1, wherein said first conductivity type is N-type and said second conductivity type is P-type.

7. The device of claim 1, wherein said field insulation material is silicon dioxide.

8. The device of claim 1, wherein said impurities of said first and second conductivity types are formed by implanting said impurities into said silicon substrate and then diffusing said impurities.

9. The device of claim 1, wherein said overlaying insulation layer is a low temperature oxide layer.

* * * * *